United States Patent
Cole et al.

(10) Patent No.: US 9,590,611 B2
(45) Date of Patent: Mar. 7, 2017

(54) RADIATION-HARDENED DUAL GATE SEMICONDUCTOR TRANSISTOR DEVICES CONTAINING VARIOUS IMPROVED STRUCTURES INCLUDING MOSFET GATE AND JFET GATE STRUCTURES AND RELATED METHODS

(71) Applicant: The United States of America as represented by the Secretary of the Navy, Washington, DC (US)

(72) Inventors: Patrick L. Cole, Bedford, IN (US); Adam R. Duncan, Bloomington, IN (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/683,438

(22) Filed: Apr. 10, 2015

(65) Prior Publication Data

US 2015/0295571 A1 Oct. 15, 2015

Related U.S. Application Data

(60) Provisional application No. 61/977,678, filed on Apr. 10, 2014.

(51) Int. Cl.
*H03K 17/14* (2006.01)
*H01L 27/06* (2006.01)
(Continued)

(52) U.S. Cl.
CPC ........... *H03K 17/14* (2013.01); *G01R 35/005* (2013.01); *G01T 1/026* (2013.01);
(Continued)

(58) Field of Classification Search
CPC H01L 27/1203; H01L 2924/00; H01L 21/845
See application file for complete search history.

(56) References Cited

U.S. PATENT DOCUMENTS 5,005,061 A * 4/1991 Robb .................. H01L 27/0251
257/262
6,163,052 A 12/2000 Liu et al.
(Continued)

OTHER PUBLICATIONS www.nxp.com/documents/data_sheet/BF998.pdf; Discrete Semiconductors—Silicon N-channel dual gate MOS-FETs; printed Sep. 14, 2016; 15 pages.

*Primary Examiner* — Marc Armand
*Assistant Examiner* — Shannon Yi
(74) *Attorney, Agent, or Firm* — Christopher A. Monsey

(57) ABSTRACT

Systems and methods for controlling current or mitigating electromagnetic or radiation interference effects using structures configured to cooperatively control a common semiconductive channel region (SCR). One embodiment includes providing a metal oxide semiconductor field effect transistor (MOSFET) section formed with an exemplary SCR and two junction field effect transistor (JFET) gates on opposing sides of the MOSFET's SCR such that operation of the JFET modulates or controls current through the MOSFET's. With two JFET gate terminals to modulate various embodiments' signal(s), an improved mixer, demodulator, and gain control element in, e.g., analog circuits can be realized. Additionally, a direct current (DC)-biased terminal of one embodiment decreases cross-talk with other devices. A lens structure can also be incorporated into MOSFET structures to further adjust operation of the MOSFET. An embodiment can also include a current leakage mitigation structure configured to reduce or eliminate current leakage between MOSFET and JFET structures.

24 Claims, 17 Drawing Sheets

(51) Int. Cl.

| | | |
|---|---|---|
| *H01L 29/78* | (2006.01) | |
| *H01L 29/10* | (2006.01) | |
| *H01L 21/8234* | (2006.01) | |
| *H03G 3/30* | (2006.01) | |
| *H01L 31/08* | (2006.01) | |
| *H03K 17/567* | (2006.01) | |
| *G01R 35/00* | (2006.01) | |
| *H01L 27/098* | (2006.01) | |
| *G01T 1/02* | (2006.01) | |
| *H01L 27/085* | (2006.01) | |
| *H01L 29/423* | (2006.01) | |
| *H01L 29/66* | (2006.01) | |
| *H03G 1/00* | (2006.01) | |
| *H01L 29/808* | (2006.01) | |

(52) U.S. Cl.
CPC .. *H01L 21/823412* (2013.01); *H01L 27/0617* (2013.01); *H01L 27/085* (2013.01); *H01L 27/098* (2013.01); *H01L 29/1045* (2013.01); *H01L 29/1058* (2013.01); *H01L 29/42368* (2013.01); *H01L 29/66484* (2013.01); *H01L 29/78* (2013.01); *H01L 29/7832* (2013.01); *H01L 31/08* (2013.01); *H03G 1/007* (2013.01); *H03G 3/3036* (2013.01); *H03K 17/567* (2013.01); *H01L 29/808* (2013.01)

(56) References Cited

U.S. PATENT DOCUMENTS

| | | | | |
|---|---|---|---|---|
| 6,414,318 | B1* | 7/2002 | Uber, III | G01R 19/2509 |
| | | | | 250/250 |
| 2007/0267762 | A1* | 11/2007 | Yu | H01L 29/66643 |
| | | | | 257/212 |
| 2010/0188163 | A1* | 7/2010 | Goto | H01L 21/82342 |
| | | | | 333/103 |
| 2013/0020635 | A1* | 1/2013 | Yilmaz | H01L 27/088 |
| | | | | 257/334 |
| 2013/0126968 | A1* | 5/2013 | Lin | H01L 29/7816 |
| | | | | 257/335 |
| 2014/0340155 | A1* | 11/2014 | Berndsen | H03F 1/0277 |
| | | | | 330/291 |
| 2015/0311076 | A1* | 10/2015 | Hiyoshi | H01L 29/66068 |
| | | | | 257/77 |

* cited by examiner

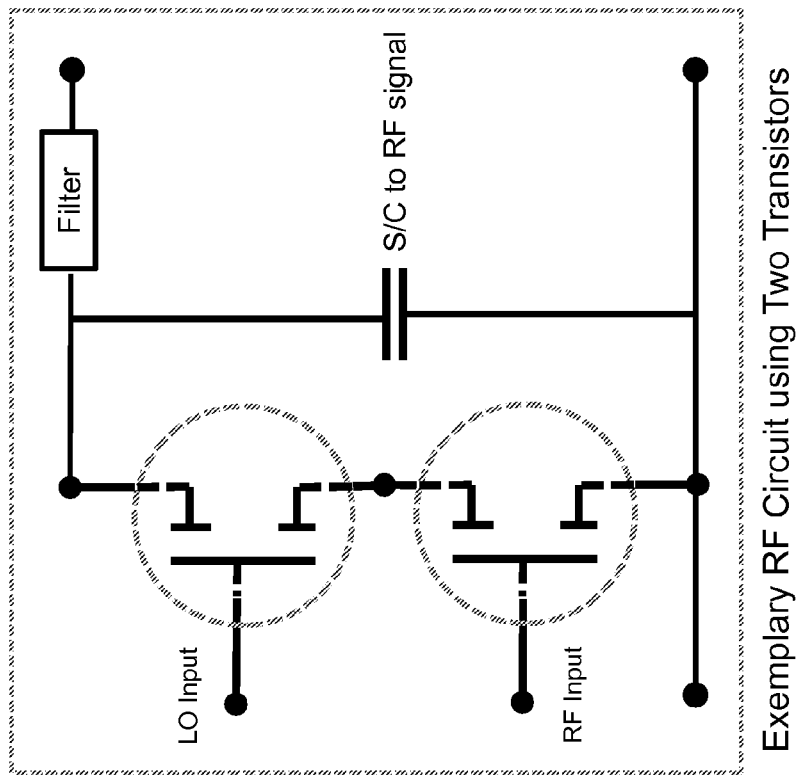
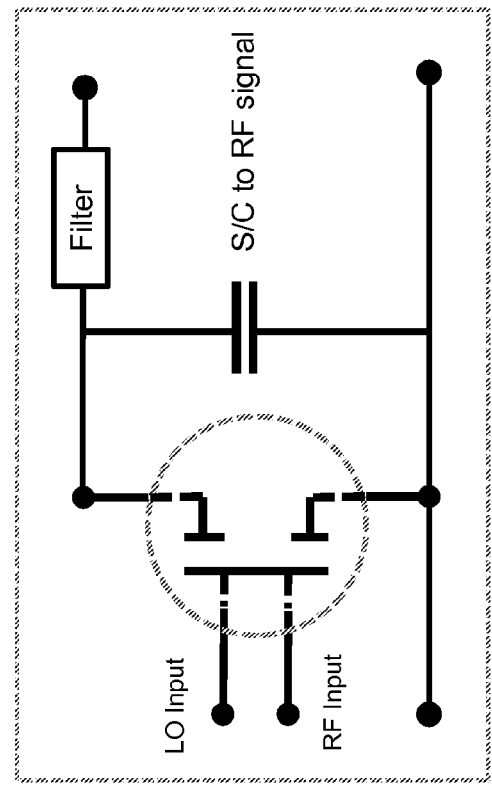
FIG. 7
Prior Art

Exemplary mixer/demodulator circuit with NCMOS.

Exemplary Amplifier with Automatic Gain Control

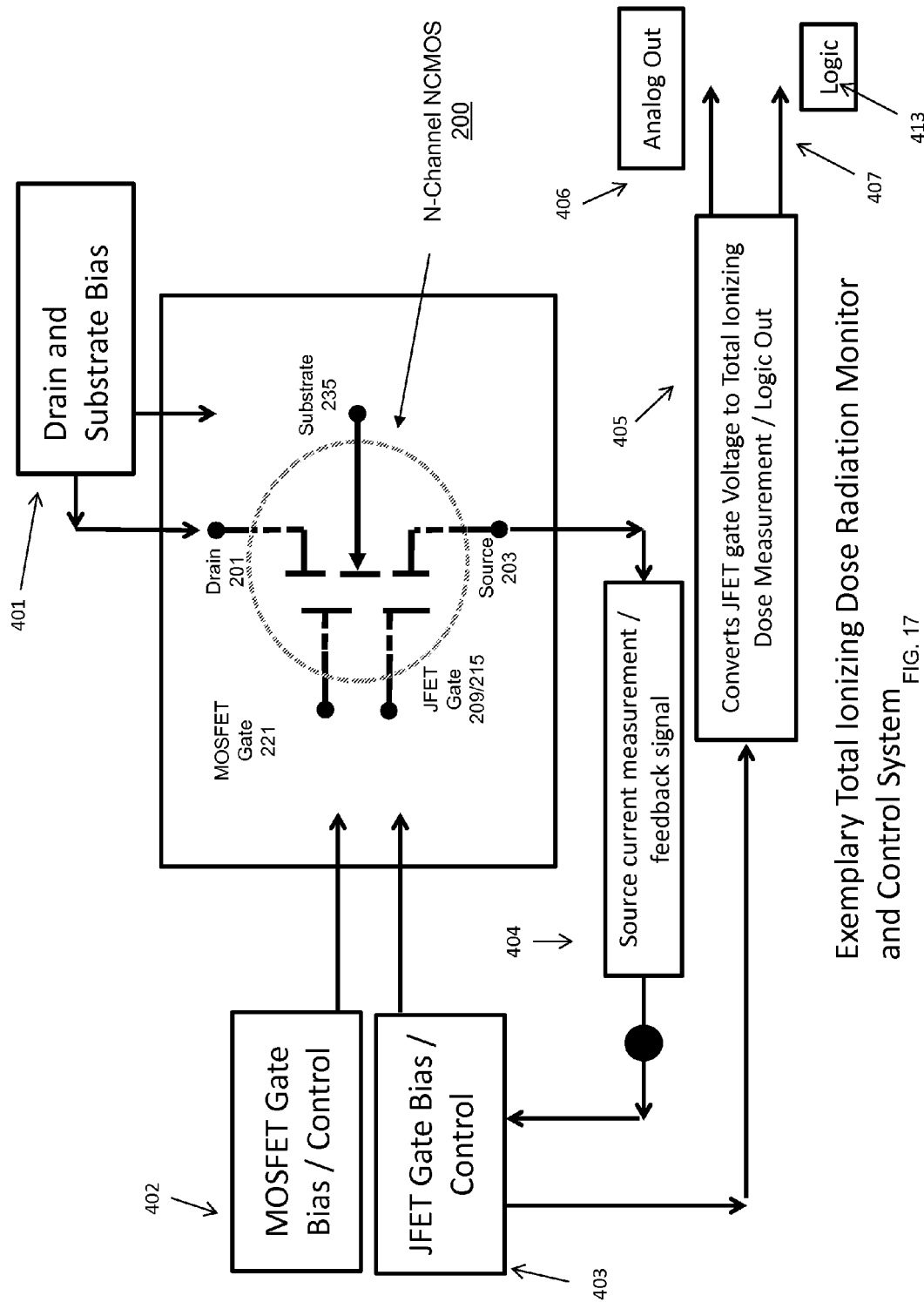
FIG. 17 Exemplary Total Ionizing Dose Radiation Monitor and Control System

RADIATION-HARDENED DUAL GATE SEMICONDUCTOR TRANSISTOR DEVICES CONTAINING VARIOUS IMPROVED STRUCTURES INCLUDING MOSFET GATE AND JFET GATE STRUCTURES AND RELATED METHODS

CROSS-REFERENCE TO RELATED APPLICATIONS

The present application claims priority to U.S. Provisional Patent Application Ser. No. 61/977,678, filed Apr. 10, 2014, entitled "RADIATIONED HARDENED DUAL GATE SEMICONDUCTOR TRANSISTOR DEVICE CONTAINING A MOSFET GATE AND JFET GATE," the disclosure of which is expressly incorporated by reference herein.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon. This invention (Navy Case 103,212) is assigned to the United States Government and is available for licensing for commercial purposes. Licensing and technical inquiries may be directed to the Technology Transfer Office, Naval Surface Warfare Center Crane, email: Cran_CTO@navy.mil.

BACKGROUND AND SUMMARY OF THE INVENTION

This disclosure is related to the field of semiconductor and electrical systems. In particular, this disclosure includes systems and components including, for example, various embodiments of a new capabilities metal oxide semiconductor (NCMOS). Methods of manufacturing and operation are also included.

Metal Oxide Field Effect Transistors (MOSFETs) are used because of their fast switching, low power capabilities. FIG. 1 represents a simplistic vertical cross-sectional view of an N-channel MOSFET 1 design/layout where the structure is sliced parallel to a source and drain along the length of a channel (for reference, see FIG. 2, orientation of cutline AB used in FIG. 1). FIG. 3 represents prior art, a simplistic vertical cross-sectional view of a P-channel MOSFET 3 design/layout where the structure is sliced parallel to a source and drain along the length of a channel (for reference, see FIG. 4, orientation of cutline AB used in FIG. 3). An exemplary N-channel MOSFET 1 as shown in FIG. 1 uses a P-type substrate 115; whereas, an exemplary P-channel MOSFET 3 as shown in FIG. 3 uses an N-type substrate 135. A conductive layer contacting a bottom of the substrate forms a substrate contact 117 (for N-channel) or substrate contact 137 (for P-channel). At top of exemplary substrate 117 or 137, a region of opposite doping 105, 107 (for N-channel) and 125, 127 (for P-channel) is implanted/diffused to form a doped region (hereinafter referred to as body) (e.g., N-channel devices use N-type body 105, 107 and P-channel devices use N-type body 125, 127). To ensure contact to body regions, a higher doped region can be implanted/diffused into the exemplary body (not shown). Once doped regions are formed (e.g., P-type bodies 105, 107 or N-type bodies 125, 127), a conductive layer can be deposited to make drain contact 101 or 121 and source contact 103 or 123 forming a portion of an electrical conductive path (shown as dashed line through these areas) for an electrical power supply (not shown). A dielectric material (e.g., a gate oxide 109 or 129) can be placed on top of substrate region (e.g., P-type substrate 115 or N-type substrate 135) and over/between body regions (e.g., N-type body regions 105, 107 or P-type body regions 125, 127). Referring to FIG. 1, a MOS gate contact 111 is formed by placing a conductive layer on top of gate oxide 109. A region separated between N-type body regions 105, 107 but underneath gate oxide 109 defines a semi-conductive channel region (SCR) 113. Referring to FIG. 3, a MOS gate contact 131 is formed by placing a conductive layer on top of gate oxide 129. A region separated between P-type body regions 125, 127 and underneath gate oxide 129 defines a semi-conductive channel region (SCR) 133. Dashed arrow lines represent an electrical conductive path that is formed during operation of FIGS. 1 and 3 MOSFETs.

Various modifications/improvements in the design, layout, and fabrication of metal-oxide-semiconductor field-effect transistors (MOSFETs) have been made to enhance electrical and radiation performance (e.g., lower power, faster switching, enhanced radiation hardness, etc.). Radiation issues have been discovered and significant research has been devoted to resolve specific radiation issues (e.g., total ionizing dose (TID) and single-event gate rupture issues).

Under normal MOSFET operation, application of an appropriate gate voltage (a gate voltage greater than MOSFET's gate threshold voltage) forms a conducting path between source and drain (forming a channel region along a surface) allowing current to flow (MOSFET is turned on). Higher gate voltage above threshold voltage equates to higher current flow. An effect of TID is to trap charge, e.g. positive charge, within a gate oxide, which in turn induces a shift in MOSFET gate threshold voltage (e.g., gate threshold voltage changes with TID). If this TID-induced threshold voltage shift becomes sufficiently large, the radiation induced trapped charge interferes with functional behavior of the MOSFET's gate (e.g., the MOSFET begins to act like electrons are on its MOSFET gate) gradually rendering the MOSFET non-functional (e.g., N-channel MOSFET cannot be turned off while P-channel MOSFET cannot be turned on without exceeding its electrical specification). Methods exist to help resolve TID issues exhibited by MOSFETs. One method is to decrease the thickness of a MOSFET's gate oxide (thinner gate oxide trap less charge) but a thinner gate oxide makes a MOSFET more susceptible to SEGR and increases gate capacitance. Another method is to control quality of gate dielectric material but higher quality equates to higher costs and lot-to-lot variability. Another method is to exceed a gate voltage specification that drives a MOSFET (gate voltage to turn-on or turn-off a MOSFET) but the gate threshold voltage can shift beyond safe operating voltages.

FIG. 5 shows a cross-sectional view of a simplified design/layout of an exemplary P-channel Junction-Field-Effect Transistor (JFET) 5 with the JFET structure cut perpendicular to drain contact 141 and source contact 143 along the JFET gates 149, 151. FIG. 6 shows a cross-sectional view of a simplistic design/layout of an exemplary N-channel JFET, with the JFET structure cut perpendicular to drain contact 161 and source contact 163 along the JFET gates 169, 171. A JFET uses a reverse-biased P-N junction to control current flow by modulating the depletion field lines 155 or 175 within the Semi-conductive channel region (SCR) 157 or 177 (a higher reverse voltage applied to PN junction extends the depletion field lines further outward restricting current flow in SCR 177). P-Channel JFET uses a P-Type Substrate 153 and N-Channel JFET uses an N-Type Substrate 173. A conductive layer can be deposited onto opposite ends of substrate forming a drain contact 141 (for P-channel) or 161 (for N-channel) and a source contact 143 (for P-channel) or 163 (for N-channel). Toward a middle of 153 (for P-channel) or 173 (for N-channel), a region is implanted/diffused with opposite doping of substrate (P-Channel uses an N-type Body 145, 147; whereas, N-Channel uses P-Type Body 165, 167) forming a PN junction between body and substrate regions. A conductive layer is deposited onto these opposite doped regions to form JFET gate contacts 149, 151 (for P-channel) or 169, 171 (for N-channel).

Unlike a MOSFET, a JFET exhibits a natural TID radiation hardness. TID effects in a MOSFET are caused by radiation-induced trapped charge in gate oxide interfering with modulation of semi-conductive channel region; whereas, a JFET does not employ a dielectric material to modulate semi-conductive channel region eliminating the effect of radiation-induced trapped charge.

Some applications involving radio-frequency (RF) applications such as RF mixers, RF amplifiers, RF gain control, and RF detectors may employ two individual transistors (e.g., MOSFETs) to perform an intended function. If an electrical circuit uses two transistors to accomplish an intended function, there are added costs and weight and requires more space when compared to a single transistor option. FIG. 7 shows a simplified circuit design using a dual gate transistor and the same design using two transistors to demonstrate how a dual gate transistor can be used in an actual circuit design. A dual gate transistor can be used in many other RF type applications. Note, the FIG. 7 circuit shows a dual gate scheme which requires a different architecture than is shown in FIGS. 1-6 as there would be a different top view showing two gate contacts and some other differences. Presently, dual-gate MOSFETs can be built by packaging two MOSFETs into a hybrid-type package where the two MOSFETs are placed in series but this implementation does not address radiation effects and increases overall cost, weight and size. Another implementation is to place two MOSFETs in series using a monolithic type layout. Again, this implementation does not address radiation effects.

Embodiments of the invention provide improvements to address various disadvantages and provide desired improvements. For example, one embodiment of the invention, such as an exemplary NCMOS, can include a layout/design of an innovative structure which allows a drain-to-source current to be controlled by a MOS gate as well as be controlled by a side JFET gate. An exemplary NCMOS can be fabricated as a monolithic device (merging aspects of MOSFET functions with a MOS gate and JFET gates into a monolithic device). One embodiment's basic fabrication steps (design/layout) of an exemplary NCMOS can include implanting/diffusing the JFET gates in conjunction with elements of manufacturing of a MOSFET gate. Exemplary embodiments of the invention, e.g., NCMOS, can also enhance operational performance in a TID radiation environment. Existing MOSFETs can be prone to TID-induced threshold voltage (VTH) shifts from ionizing radiation environments that can lead to functional failure. An exemplary embodiment's independent JFET Gate can provide a radiation-hardened-by-design (RHBD) approach if MOS gate functionally fails from TID effects by using side JFET gates to control current flow beyond operational failure point of MOS gate (e.g., an exemplary improved side JFET gate allows the exemplary structure to control current in the semi-conductive channel region even after the MOS gate becomes non-functional from TID-induced threshold voltage shifts). Additionally, an exemplary NCMOS can be useful in RF type applications such as mixers, gain control, amplifiers, and detectors because the exemplary device employs a second independent gate to control current flow in the semi-conductive channel region. A variety of MOSFET gate oxide lens structures as well as a current leakage preventing or mitigation structures are also provided. Control systems are also provided to operate various embodiments of the invention in a variety of modes of operation. Methods of manufacturing and operation are also provided.

Additional features and advantages of the present invention will become apparent to those skilled in the art upon consideration of the following detailed description of the illustrative embodiment(s) exemplifying some best modes of carrying out the invention as presently perceived.

BRIEF DESCRIPTION OF THE DRAWINGS

The detailed description of the drawings particularly refers to the accompanying figures in which:

FIG. 7 provides a simplified RF application schematic view using a dual gate transistor and another circuit using two transistors;

FIG. 17 shows an exemplary simplified block diagram circuit for the use of the NCMOS device for the measurement of TID.

DETAILED DESCRIPTION OF THE DRAWINGS

The embodiments of the invention described herein are not intended to be exhaustive or to limit the invention to precise forms disclosed. Rather, the embodiments selected for description have been chosen to enable one skilled in the art to practice the invention.

Figure 1:
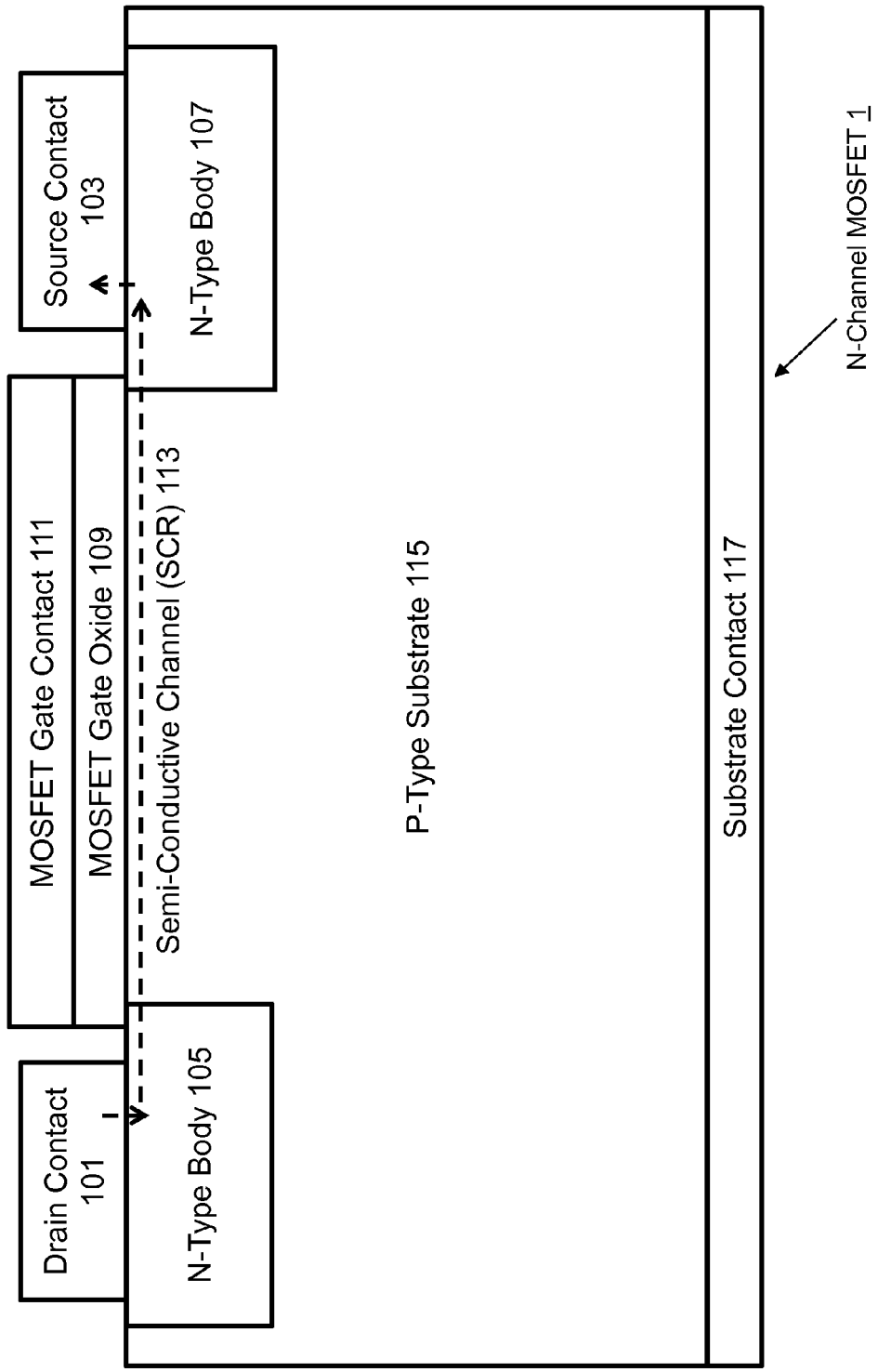
FIG. 1 shows a simplified cross-sectional side view of a N-channel MOSFET.
Figure 2:
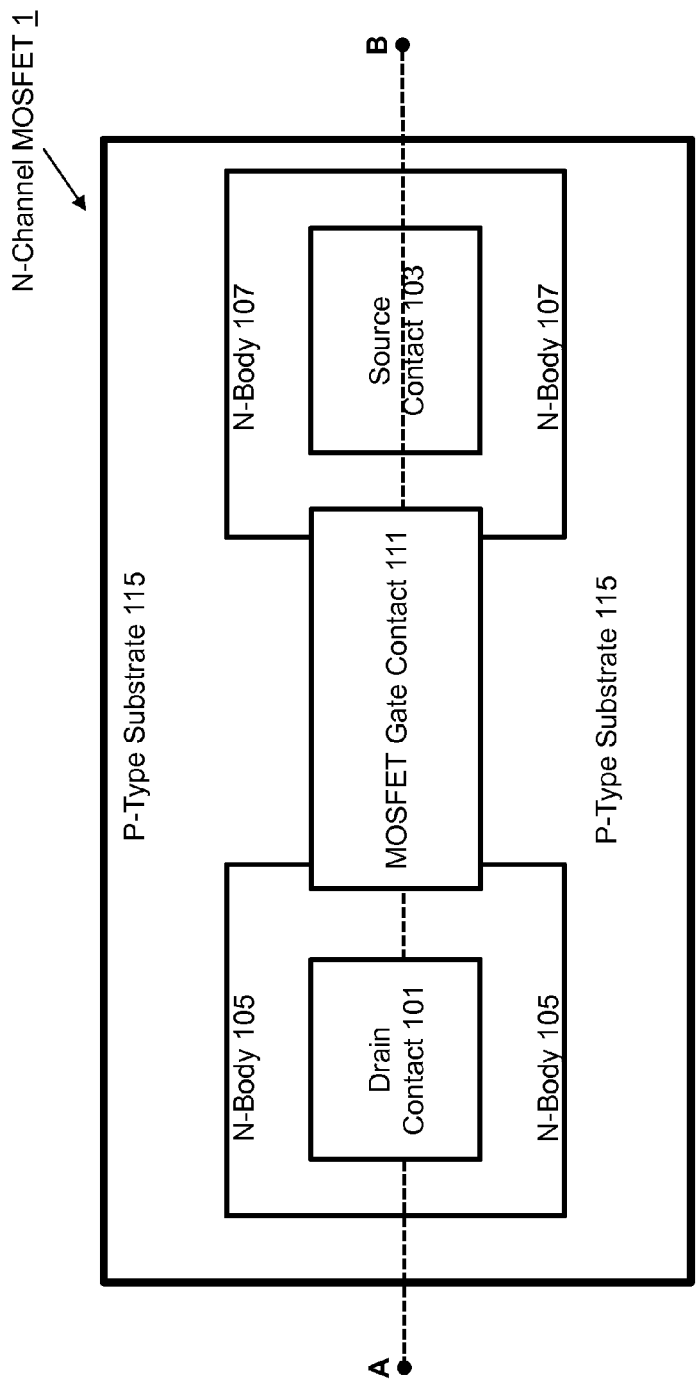
FIG. 2 shows a simplified top view of a N-channel MOSFET.
Figure 3:
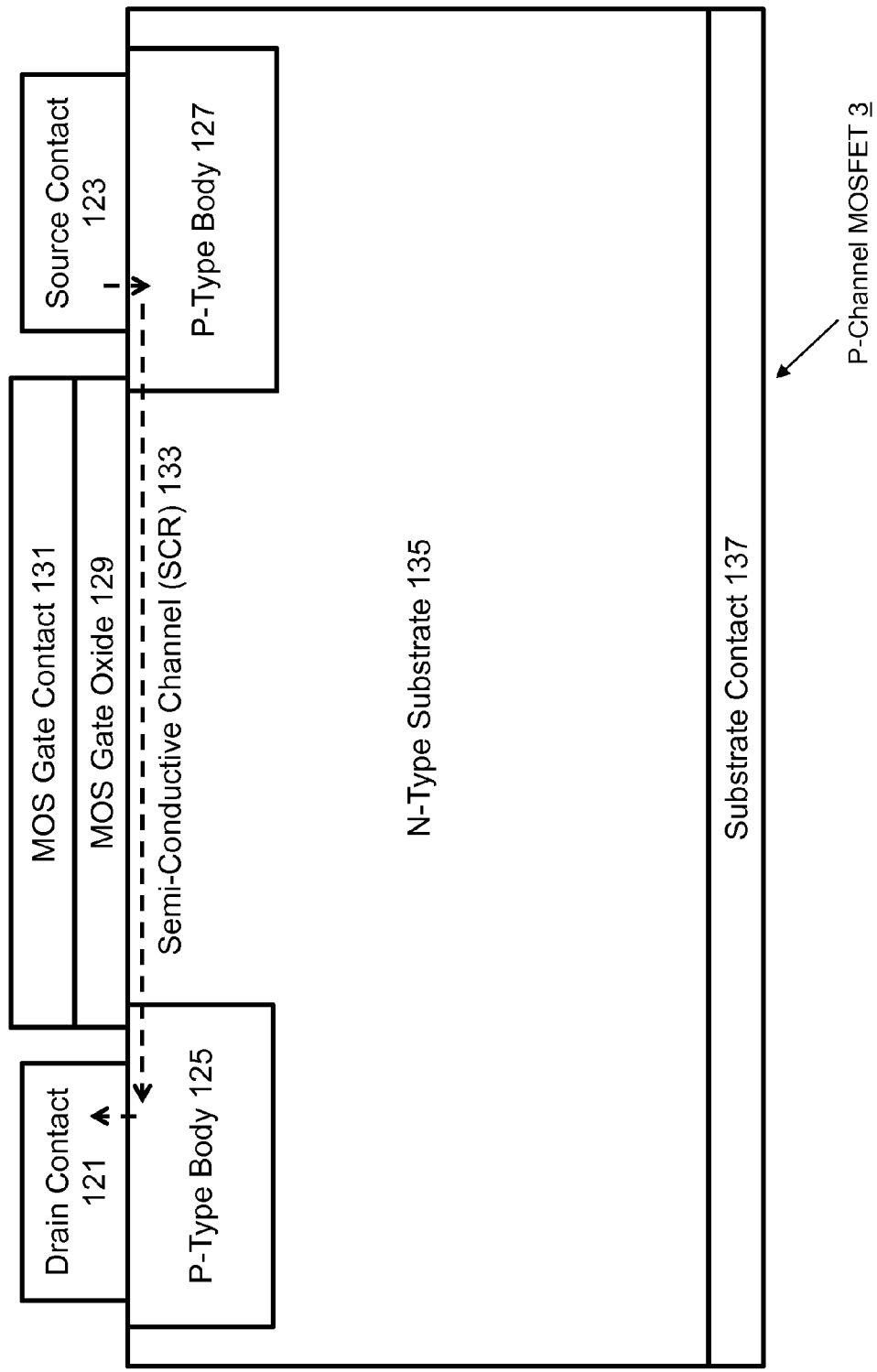
FIG. 3 shows a simplified cross-sectional side view of a P-channel MOSFET.
Figure 4:
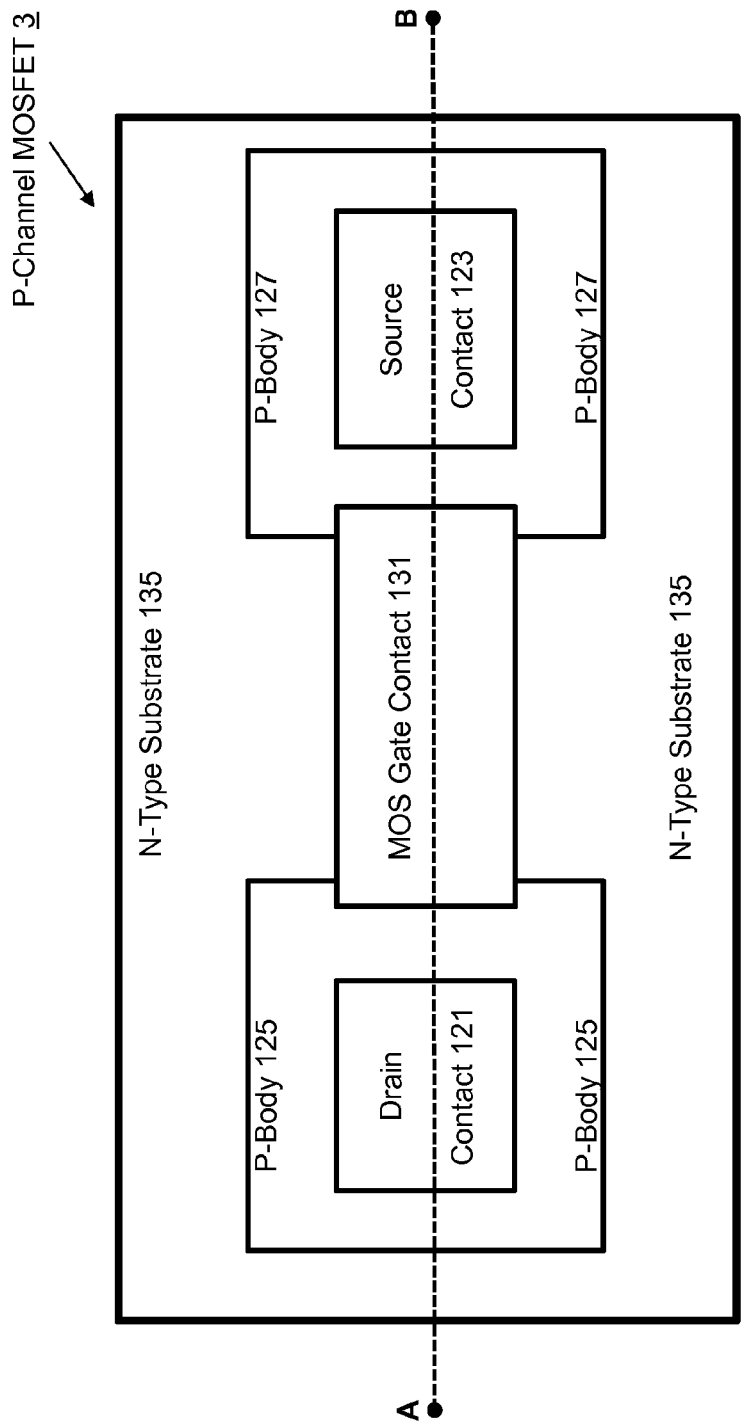
FIG. 4 shows a simplified top view of a P-channel MOSFET.
Figure 5:
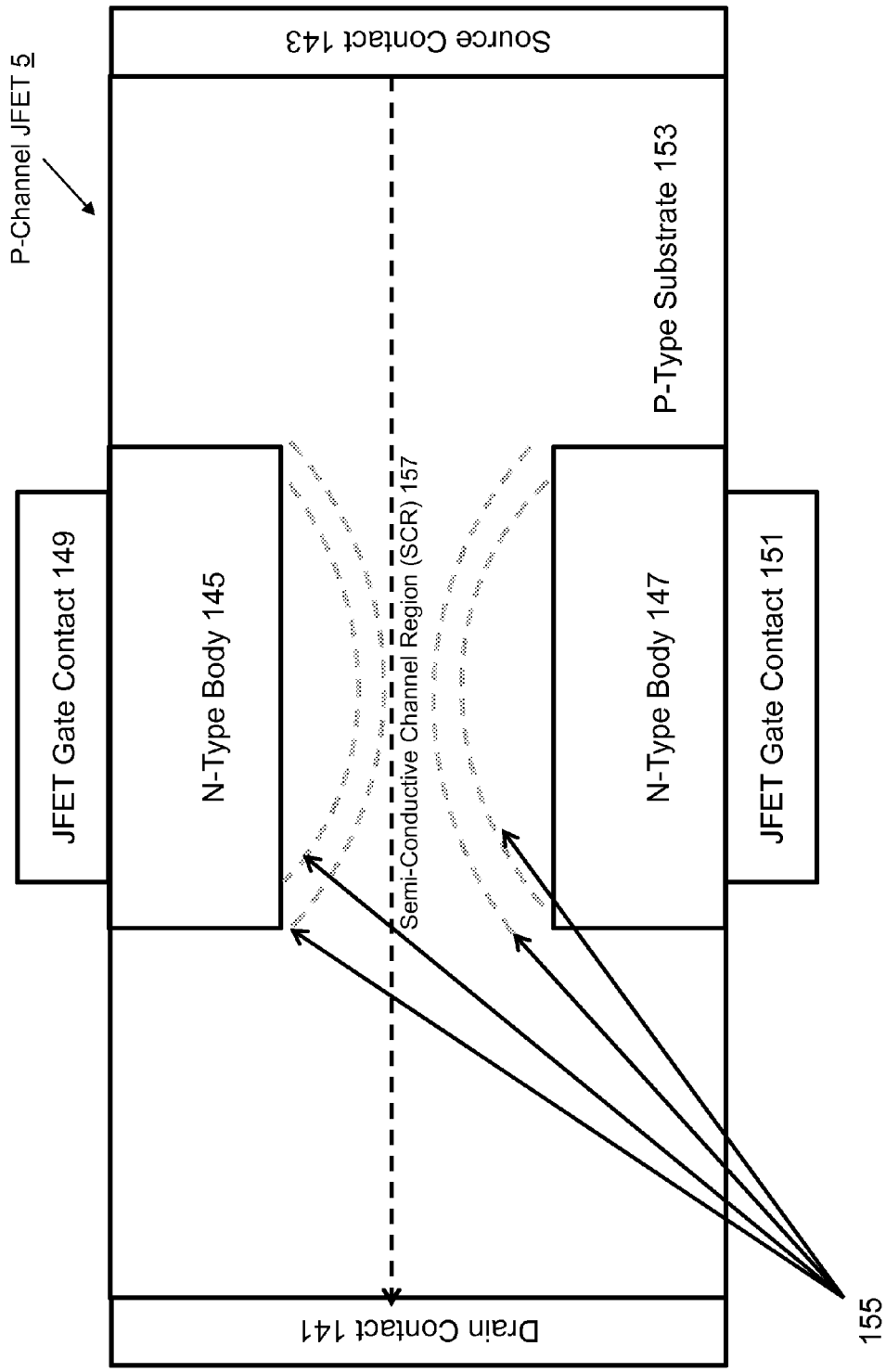
FIG. 5 shows a simplified cross-sectional side view of a N-channel JFET.
Figure 6:
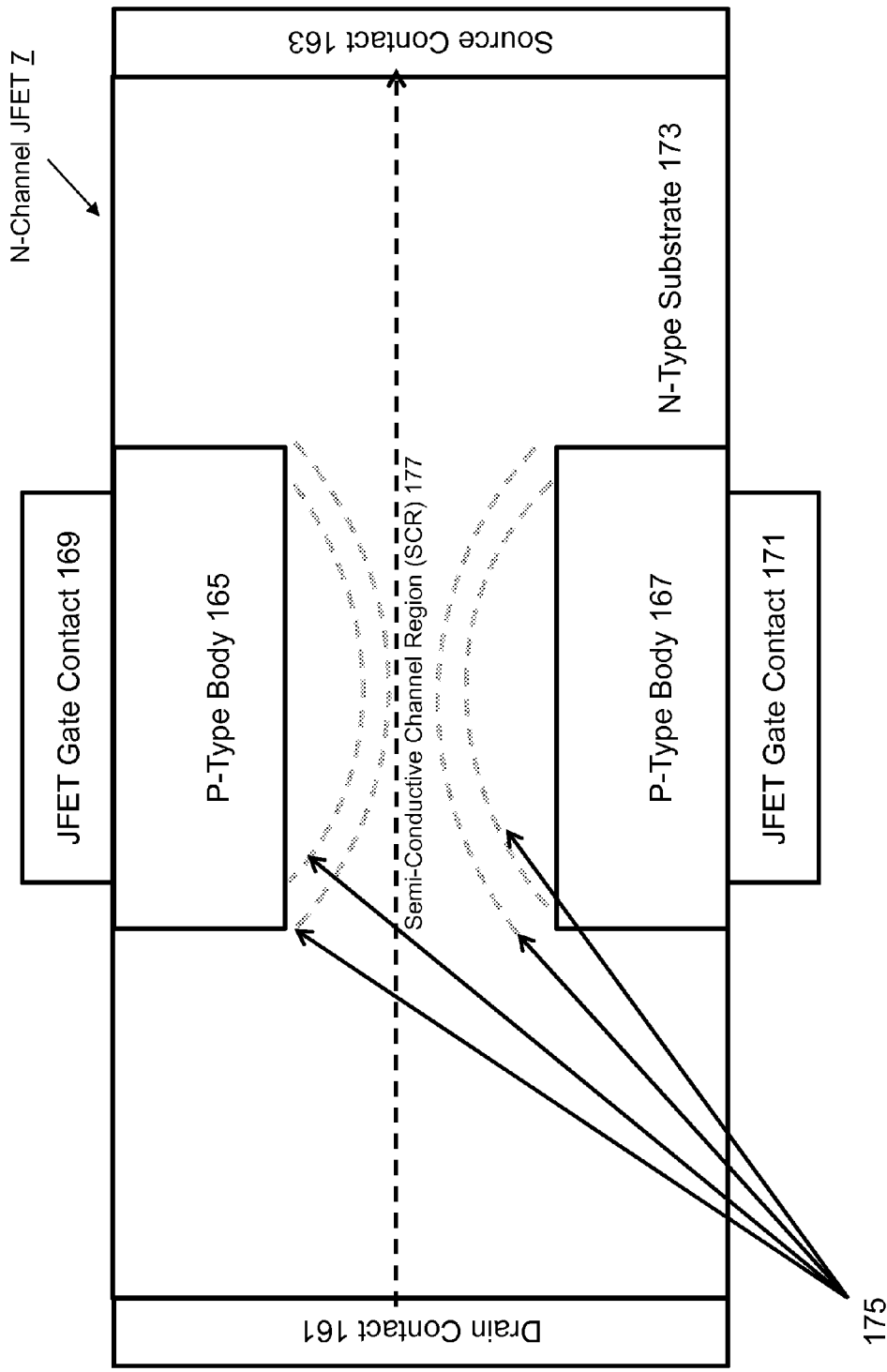
FIG. 6 shows a simplified cross-sectional top view of a P-channel JFET.
Figure 8:
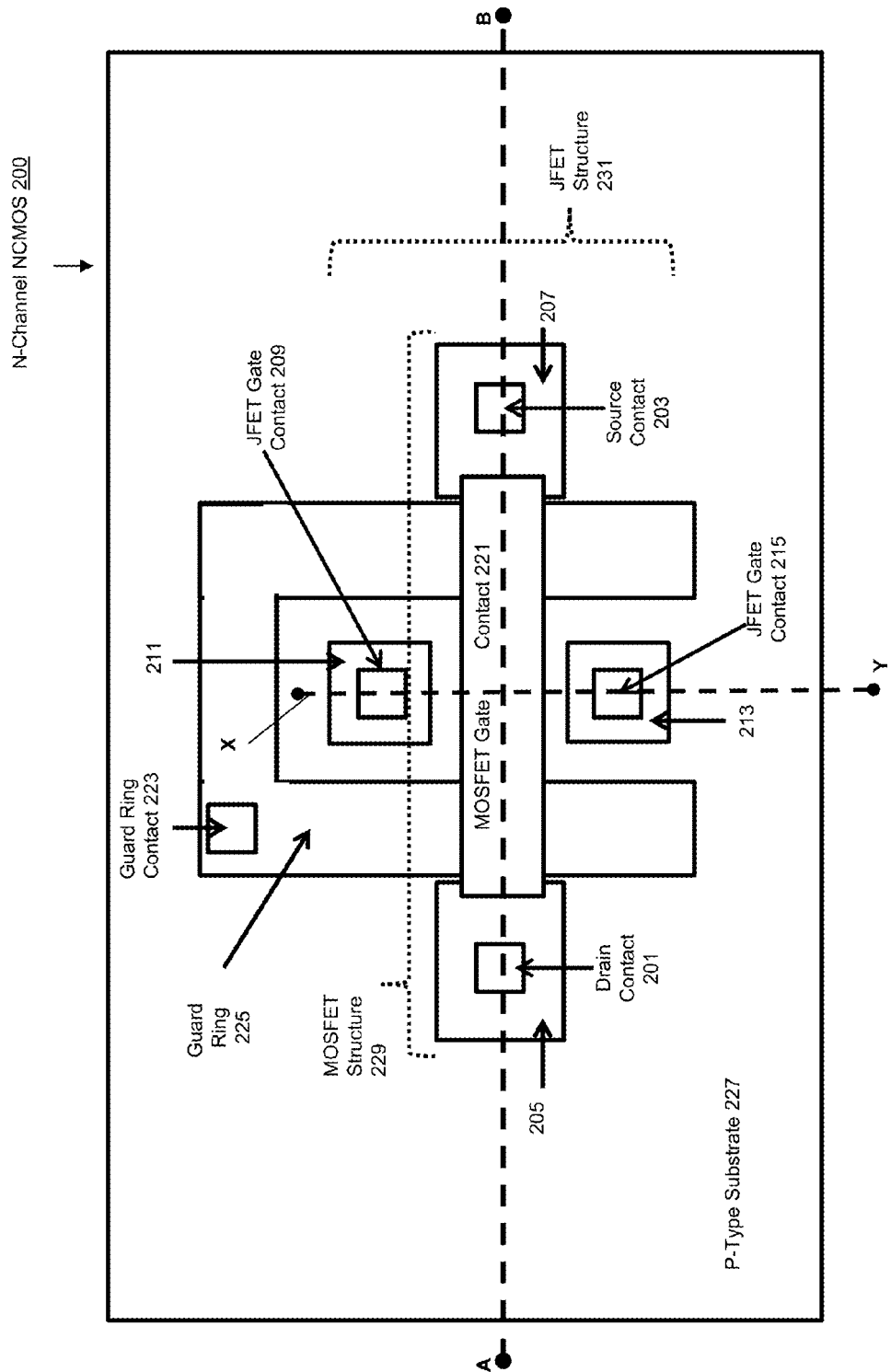
FIG. 8 shows a simplified cross-sectional top view of an exemplary N-channel NCMOS in accordance with one embodiment of the invention.
Figure 9:
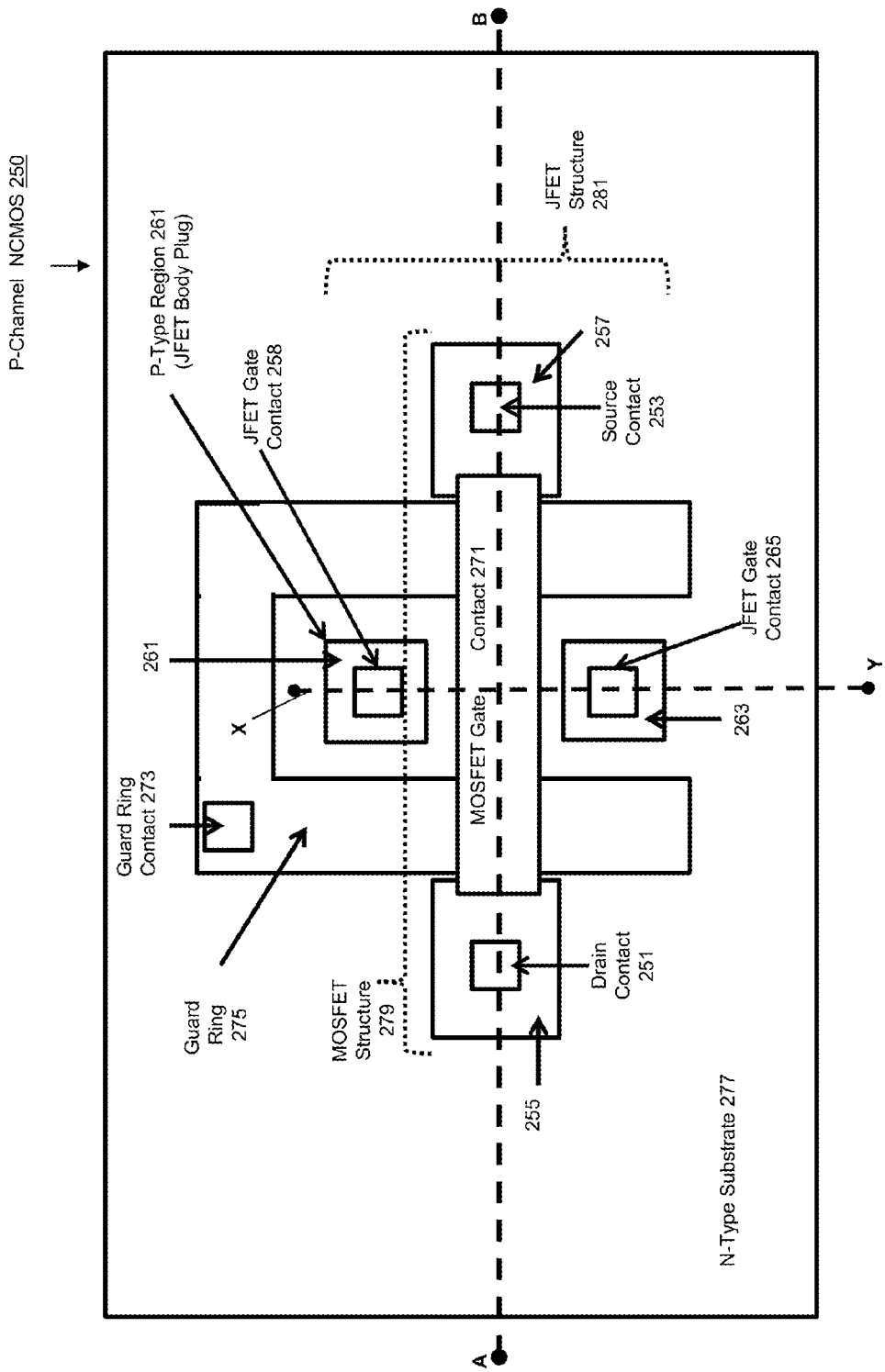
FIG. 9 shows a simplified cross-sectional top view of an exemplary P-channel NCMOS in accordance with one embodiment of the invention.
Figure 10:
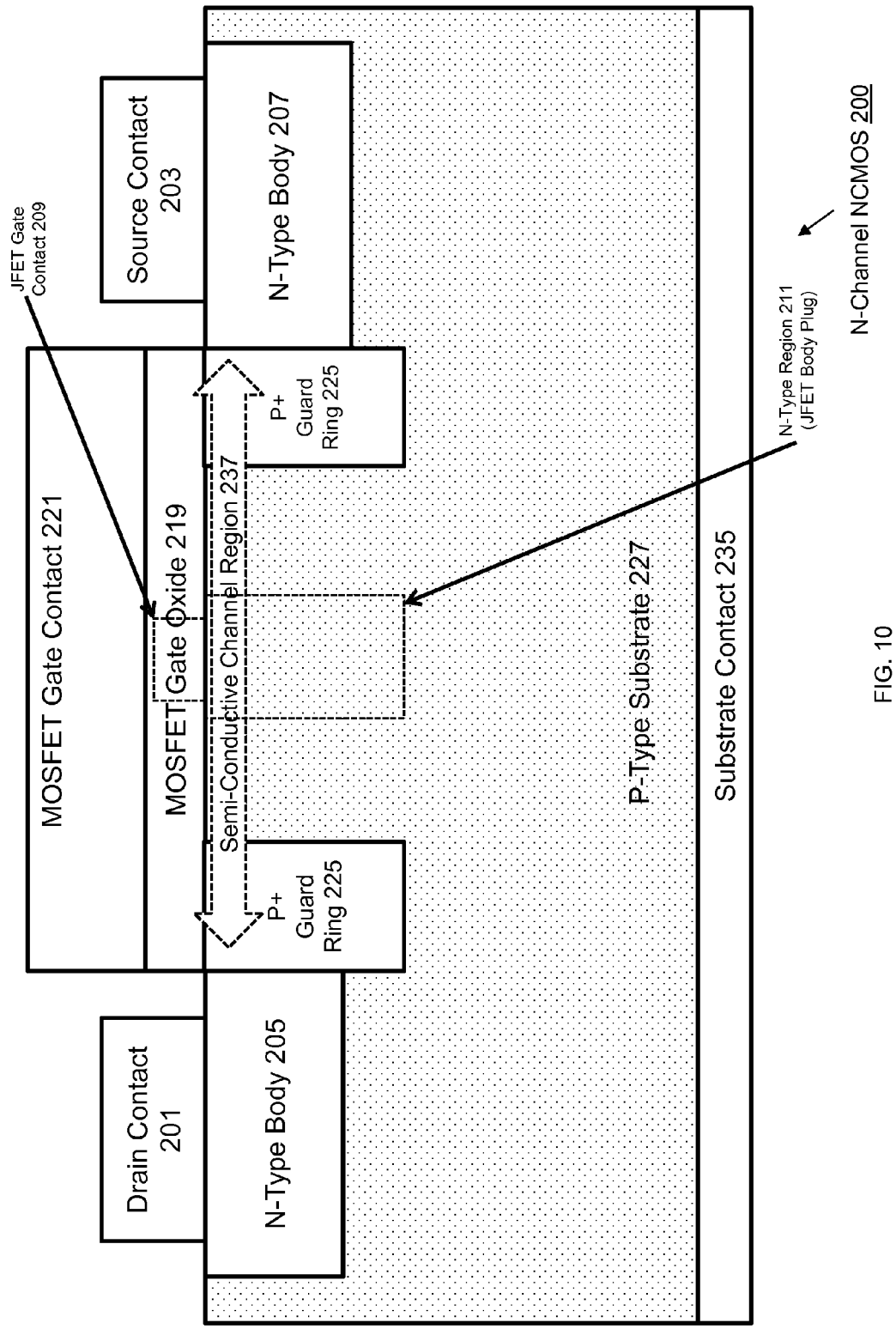
FIG. 10 shows a simplified cross-sectional side view of an exemplary N-channel NCMOS in accordance with one embodiment of the invention.
Figure 11:
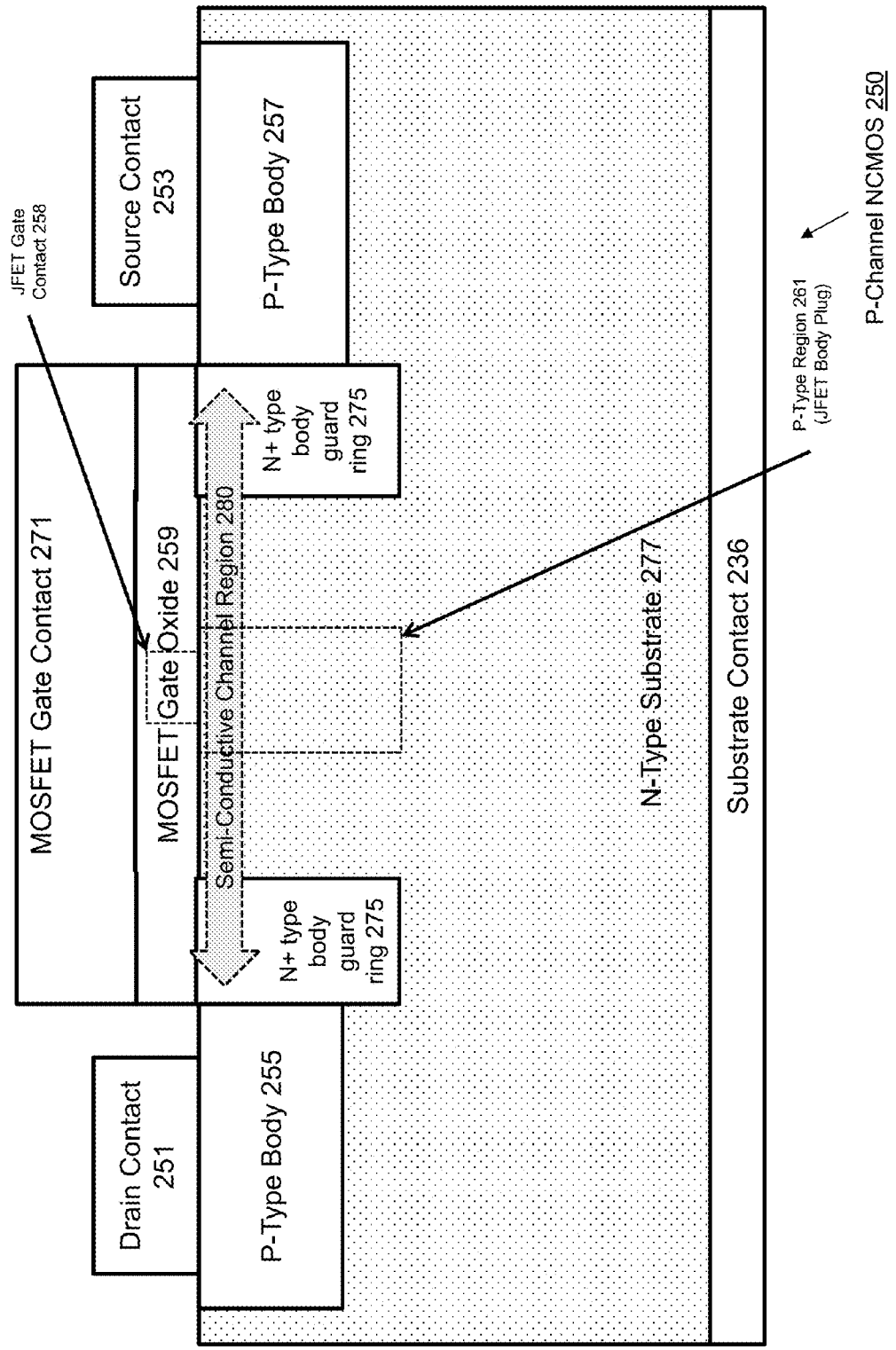
FIG. 11 shows a simplified cross-sectional side view of an exemplary P-channel NCMOS in accordance with one embodiment of the invention.

FIG. 8 depicts a top-view of exemplary NCMOS 200 (N-channel version) that includes a MOS gate 221 and side JFET (N-Type regions) gates 211 and 213. Substrate connectivity can be achieved by using a backside contact 235 (FIG. 10). FIG. 9 depicts a top-view of exemplary NCMOS 250 (P-channel version) that includes a MOS gate 271 and side JFET gates 261 and 263. Substrate connectivity can be achieved by using a backside substrate contact 236 (FIG. 11). An exemplary NCMOS structure (referred to as a cell) can be replicated and placed in parallel to provide different operational capabilities (e.g., current handling capability) depending upon number of cells that are replicated and placed in parallel.

FIG. 8 includes a P-Type Substrate 227 (e.g., a P-doped silicon layer) that is used to form a MOSFET structure 229 comprising 201/203/205/207/221/227 and used to form a JFET structure 231 comprising 209/211/213/215/227. MOSFET structure 229 includes a MOS Gate Contact 221 disposed over a portion of N-Body 207 (N-body forms a source region) extending over a portion of the P-type substrate 227, and over a portion of N-Body 205 (N-body 205 forms a drain region). In this example, a MOS Gate oxide is disposed underneath the MOS gate contact 221 but is not shown due to the cutaway nature of this view. A drain contact 201 is disposed within the N-body 205 (forming the drain region) and a source contact 203 is disposed within the N-body 207 (forming the source region). The JFET structure 231 includes two side N-type regions 211 and 213. A JFET gate contact 209 is disposed within the N-type region 211 and a second JFET gate contact 215 is disposed within the N-type region 213 (although not shown, the two JFET gate contacts 209, 215 are connected together as part of the design/layout). The MOSFET structure 229 and the JFET structure 231 are disposed within a P-Type substrate layer 227. In this exemplary embodiment, the JFET structure 231 is disposed within the P-Type substrate 227 such that when the JFET is operated, the electrical field can decouple the semi-conductive channel of the MOSFET structure 229 without said electrical field extending into the MOSFET's N-body regions 205 and 207 nor does said depletion field extend to the bottom of the P-type substrate 227. A guard ring 225 of heavily doped P-Type (doped to a higher P-Type concentration than the substrate) is located surrounding the JFET side gates 211 and 213. The guard ring 225 provides electric field shaping in the plane of the source-channel-drain to oppose leakage from the JFET side gates to the source 203 or drain 201. The guard ring 225 is disposed within the P-Type substrate. The guard ring contact 223 is disposed within the guard ring. In this example, P-Type doping that is heavier than the substrate is designated as P+.

FIG. 9 includes a MOSFET structure 279 comprising 251/253/255/257/ as well as a JFET structure 281 comprising 258/261/263/265/ both formed within an N-Type Substrate 277 (e.g., N-doped silicon layer). The MOSFET structure 279 includes a MOS Gate Contact 271 disposed over a portion of P-Body 257 (N-body forms a source region) extending over a portion of the N-type substrate 277, and over a portion of P-Body 255 (P-body 255 forms a drain region). In this example, a MOS Gate oxide is disposed underneath the MOS gate contact 271 but is not shown due to the cutaway nature of this view. A drain contact 251 is disposed within the P-body 255 (forming the drain region) and a source contact 253 is disposed within the P-body 257 (forming the source region). The JFET structure 281 includes two side P-body regions 261 and 263. A JFET gate contact 258 is disposed within the P-type body 261 and a second JFET gate contact 265 is disposed within the P-type body 263 (although not shown, the two JFET gate contacts 258, 265 are connected together as part of the design/layout). The MOSFET structure 279 and the JFET structure 281 are disposed within an N-Type substrate layer 277. In this exemplary embodiment, the JFET structure 281 is disposed within the N-Type substrate 277 such that when the JFET is operated, the depletion field can decouple the semi-conductive channel of the MOSFET structure 279 without said depletion field extending into the MOSFET's N-body regions 255 and 257, nor does said depletion field extend to the bottom of the P-type substrate 277. A guard ring 275 of heavily doped N-Type (doped with an N-Type concentration greater than the substrate 277) is located surrounding the JFET side gates. The guard ring 275 provides electric field shaping in the plane of the source-channel-drain to prevent leakage from side gates to the source 257 or drain 255. The guard ring 275 is disposed within the N-Type substrate 277. The guard ring contact 273 is disposed within the guard ring 275. We designate N-Type doping that is heavier than the doping of the substrate as N+.

Figure 12:
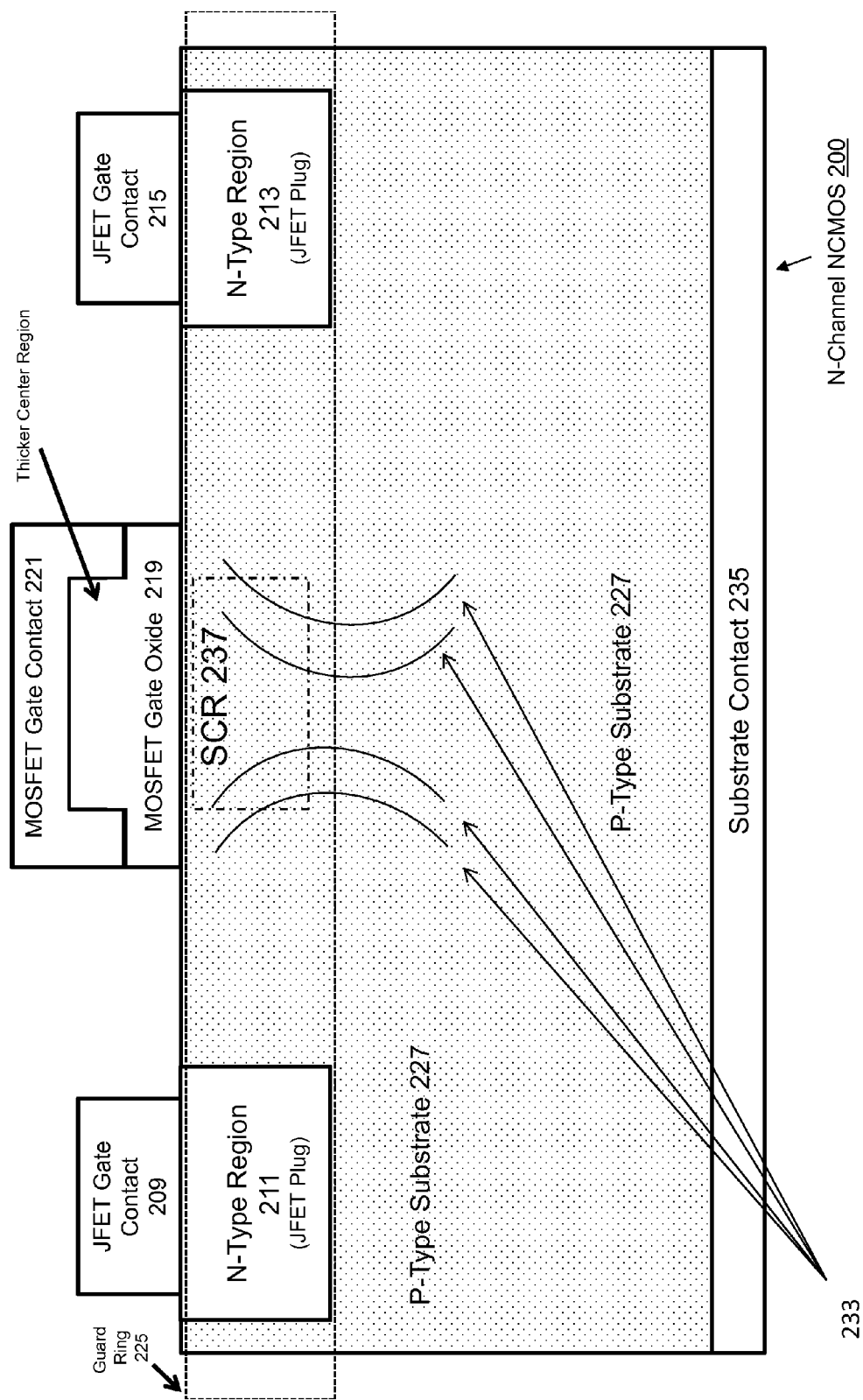
FIG. 12 shows a simplified cross-sectional side view of an exemplary P-channel NCMOS in accordance with one embodiment of the invention.

FIG. 8 depicts cut lines (A-B and X-Y) representing vertical cut lines defining views in FIG. 10 (A-B) and FIG. 12 (X-Y). FIG. 9 depict cut lines (A-B and X-Y) representing vertical cut lines defining views in FIG. 11 (A-B) and FIG. 13 (X-Y). FIG. 10 represents a simplistic cross-sectional side view (a vertical cut along line A-B in FIG. 8 providing a vertical view parallel to a drain 201 and source 203 and along semi-conductive channel region 237) and FIG. 12 represents a simplistic cross-sectional side view (a vertical cut along line X-Y in FIG. 8 providing a vertical view parallel to JFET gate contacts) of the exemplary N-channel NCMOS in accordance with one embodiment of the invention. FIGS. 10 and 12 provide elements of exemplary N-channel NCMOS structure 200 having aspects not shown in the FIG. 8 cross-sectional cutaway top view. For example, FIG. 10 shows a MOS gate oxide 219 disposed between MOS gate contact 221 and N-Type body 205/P-Type substrate 227/N-Type Body 207. This gate oxide 219 is formed with extra tiers or layers (or a lens shape) to make the gate oxide 219 thicker in its middle. Two tiers are shown (FIG. 12) in this possible embodiment, but more tiers or a single layer with a thicker middle section could be used to enhance or produce a lens shape of the gate oxide 219. In other words, a lens or electric field shaping structure of the gate oxide 219 along the drain 201-source 203 axis makes the gate contact 221 lens-shaped (FIG. 12), with a greater oxide thickness 219 in a center of the gate oxide 19. This exemplary lens shape of the gate contact tailors or shapes an electric field of the MOS gate to be less in the center of the channel than along the edges parallel to the drain-source channel, (along cut line A-B in FIG. 8). This lensing of the gate electric field allows for improved operation of the JFET action in a semi-conductive channel region (SCR) 237. The exemplary SCR 237 is provided in FIG. 10 and SCR 237 also represents one portion of an electrical current path. SCR 237 is created as a result of design of the MOSFET structure 229—for example, SCR 237 can be a region in lateral proximity to N-Type body 207 underneath a portion of MOS gate oxide 219 extending laterally across the P-type substrate 227 to the N-Type body 205 underneath a portion of MOS gate oxide 219 next to the boundary of P-Type substrate 227 and MOS gate oxide 219. A second gate used to control a portion of the SCR 237 is formed by a JFET structure 231 formed from two side gates, 211 (with JFET gate contact 209) and 213 (not shown), each an N-type region, disposed in the substrate 227 on opposing sides of the SCR 237 formed between drain 205 and source 207. In FIG. 12, lines 233 are shown which exemplify production of an electrical field created by JFET structure 231 when it is biased with an electrical power supply. A substrate contact 235 is disposed on the bottom of P-Type substrate 227.

Figure 13:
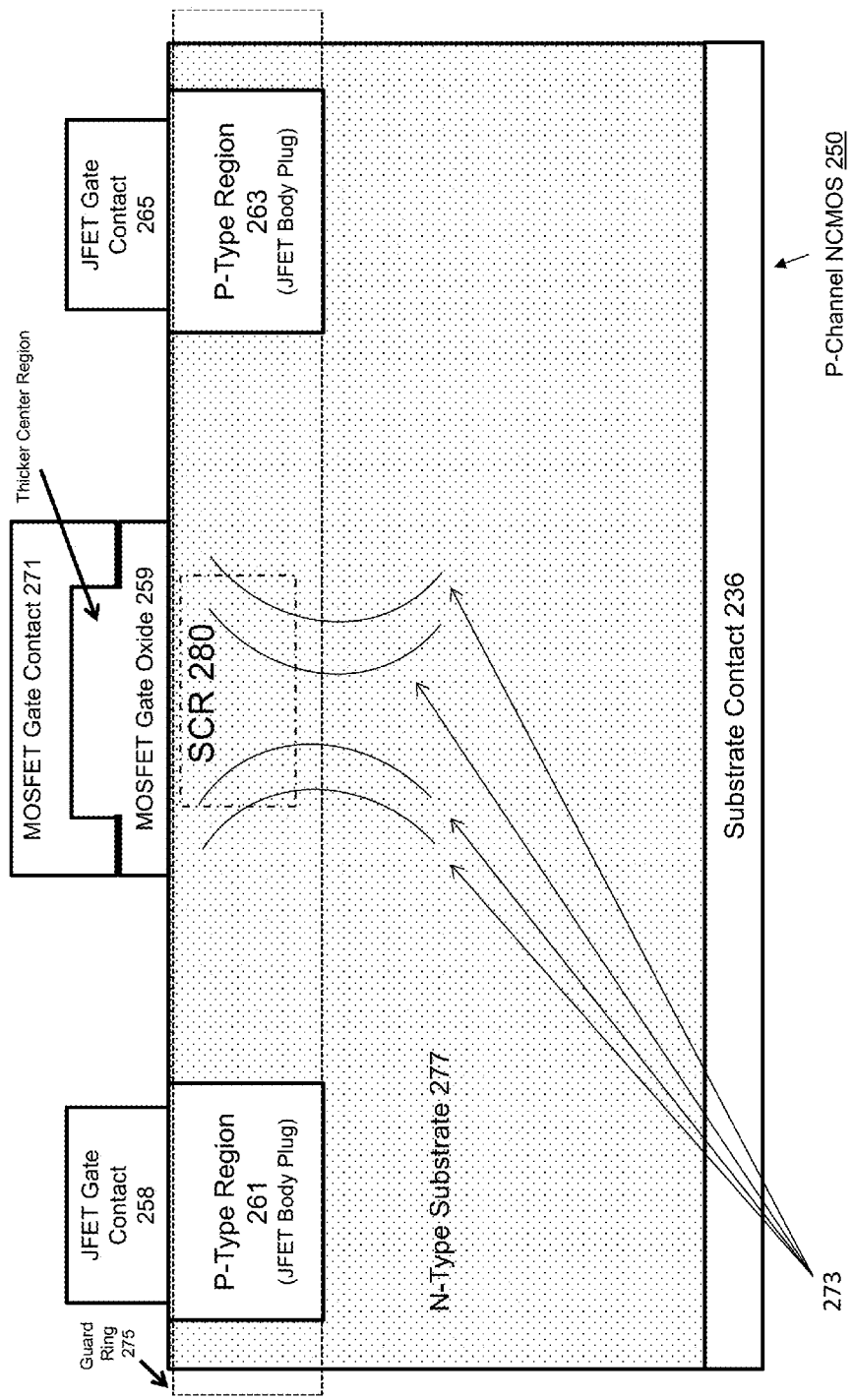
FIG. 13 shows a simplified cross-sectional side view of an exemplary N-channel NCMOS in accordance with one embodiment of the invention.

FIG. 11 presents a simplistic cross-sectional side view (along A-B cut line in FIG. 9) and FIG. 13 presents a simplistic cross-sectional side view (along X-Y cut line in FIG. 9) of the exemplary P-channel NCMOS in accordance with one embodiment of the invention. FIGS. 11 and 13 provide additional views as well as some elements of exemplary P-channel NCMOS structure 250 that are not shown the FIG. 9 cross-sectional cutaway top view. For example, FIG. 11 shows a MOS gate oxide 259 between MOS gate contact 271 and P-Type body 255/N+-Type body guard ring 275/N-Type substrate 277/N+ type body guard ring 275/P-Type Body 257. The MOS gate oxide 259 provides extra tiers or material to make the MOS gate oxide 259 thicker in the middle (e.g. see FIG. 13). Two tiers are shown in this possible embodiment, but more tiers or a single layer with a lensed shape could be used to enhance or form the lens shape of the MOS gate oxide 259. The exemplary lens shape of the gate contact 261 with a greater MOS gate oxide 259 thickness in a gate oxide center, tailors or shapes the MOS's electric field to be less in a center of the SCR 280 than along the edges parallel to the drain contact 251-source contact 253 formed SCR 280. This lensing of the gate electric field allows for improved of the JFET action in the SCR 280 also shown in FIG. 11. The exemplary SCR 280 also represents one portion of the electrical current path. SCR 280 can be created as a result of design of the MOSFET structure 279 (in FIG. 9)—for example, SCR 280 can be a region in lateral proximity to P-Type body 257 underneath a portion of MOS gate oxide 259 extending laterally across the N+-type body guard ring 275, across N-Type substrate 277, across N+-type body guard ring 275, to the P-Type body 255 underneath a portion of MOS gate oxide 259 next to the boundary of N-Type substrate 277 and MOS gate oxide 259. As also shown in FIG. 13, a second gate scheme used to control a portion of the SCR 237 is provided by JFET structure formed with two side gates, 261 and 263 (not shown but see FIG. 13), each a P-type region, disposed in the N-type substrate 277 to on opposing sides of the SCR 280 between P-type body 255 (below drain contact 251) and P-type body 257 (below source contact 253) (FIG. 11). JFET Gate Contact 258 is also shown with hidden lines positioned above the P-Type Region 261. In FIG. 13, electric field lines 273 are shown which exemplify production of an electrical field created by JFET structure 231 (as shown in FIG. 8) when it is biased with an electrical power supply. A substrate contact 236 is disposed on the bottom of N-Type substrate 277.

In the above example, there is one SCR 237 (for N-channel) or 280 (for P-channel) formed as a result of the exemplary designs shown in FIGS. 8-13 as part of the MOSFET structure 229 (for N-channel) or 279 (for P-channel) underneath the MOS gate oxide 219 (for N-channel) or 259 (for P-channel). In this embodiment, the SCR 237 (for N-channel) and 280 (for P-channel) regulates current through the MOSFET structure 229 (for N-channel) and 279 (for P-channel) where the current is controlled by voltage applied to the MOS gate contact 221 (for N-channel) and 271 (for P-channel) and by voltage applied to the JFET gate contact 209, 215 (for N-channel) and 258, 265 (for P-channel). Having two control gates, a MOS type (e.g., MOSFET structures 229 (FIG. 8) or 279 (FIG. 9)) and JFET type (e.g., JFET structures 231 (FIG. 8) or 281 (FIG. 9)), provides two independent gate type functions or capabilities that are useful for mixing signals as well as providing benefits from a radiation hardening or performance perspective. The exemplary MOSFET structure 229 (for N-channel) and 279 (for P-channel) are sensitive to radiation degradation that can be compensated for or eliminated by use of the JFET gate of the electrical field effect 233 (for N-channel) and 273 (for P-channel) extending through the substrate 227 (for P-channel) and 277 (for N-channel) and SCR 237 (for N-channel) and 280 (for P-channel) up to the gate oxide 219 (for N-channel) and 259 For (P-channel) allowing the electrical flow path (e.g., SCR 237, 280) to be altered. Various negative effects can be mitigated or eliminated by embodiments of this invention such as TID. As an example, TID effects can cause the MOS portion of SCR 237 (for N-channel) to become permanently turned on; however, TID effects do not affect the operation of the electrical field effect of the JFET gate, thus providing an alternate method to regulate the SCR 237 current flow. The N-channel NCMOS 200 design differs from the P-channel NCMOS 250 design in those references to N-Type becomes P-Type references and references to P-type become N-Type references. Note, element numbers used for elements in N-channel NCMOS design are different herein from the element numbers used for elements in exemplary P-channel NCMOS designs. References to the exemplary MOS structures and the exemplary JFET structures are also different between the N- and P-channel NCMOSs.

Figure 14:
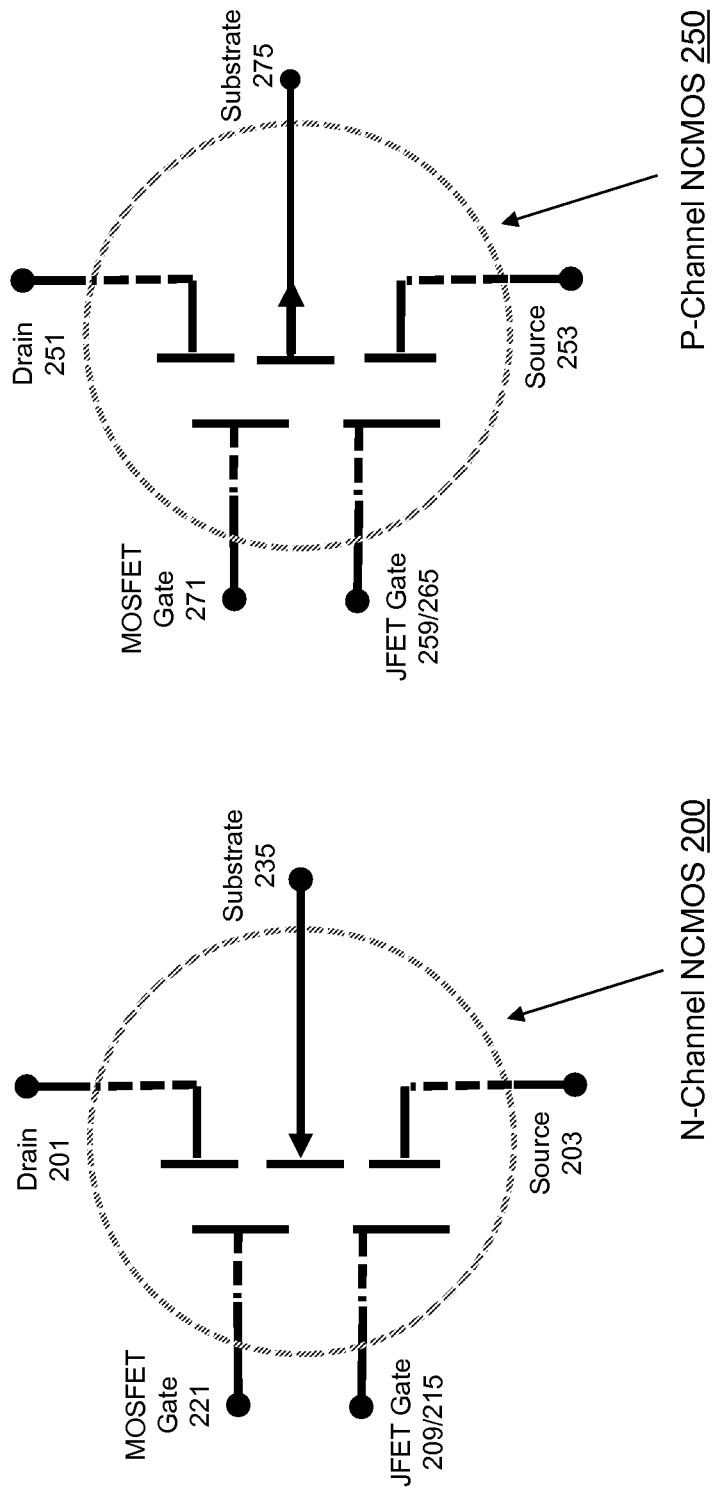
FIG. 14 shows an exemplary demodulator circuit using an exemplary NCMOS device in accordance with one embodiment of the invention.

FIG. 14 shows a simplified electrical representation of an exemplary N-channel NCMOS 200 and a P-channel NCMOS 250 in accordance with one embodiment of the invention. For the exemplary NCMOS 200 N-channel, this electrical representation shows inputs and outputs such as drain 201; source 203, MOS gate 221; side JFET gate 209/215, and substrate 235. For the exemplary NCMOS 250 P-channel, this electrical representation shows inputs and outputs such as drain contact 251; source contact 253; MOS gate 271; side JFET gate 258/265; and substrate 236.

Figure 15:
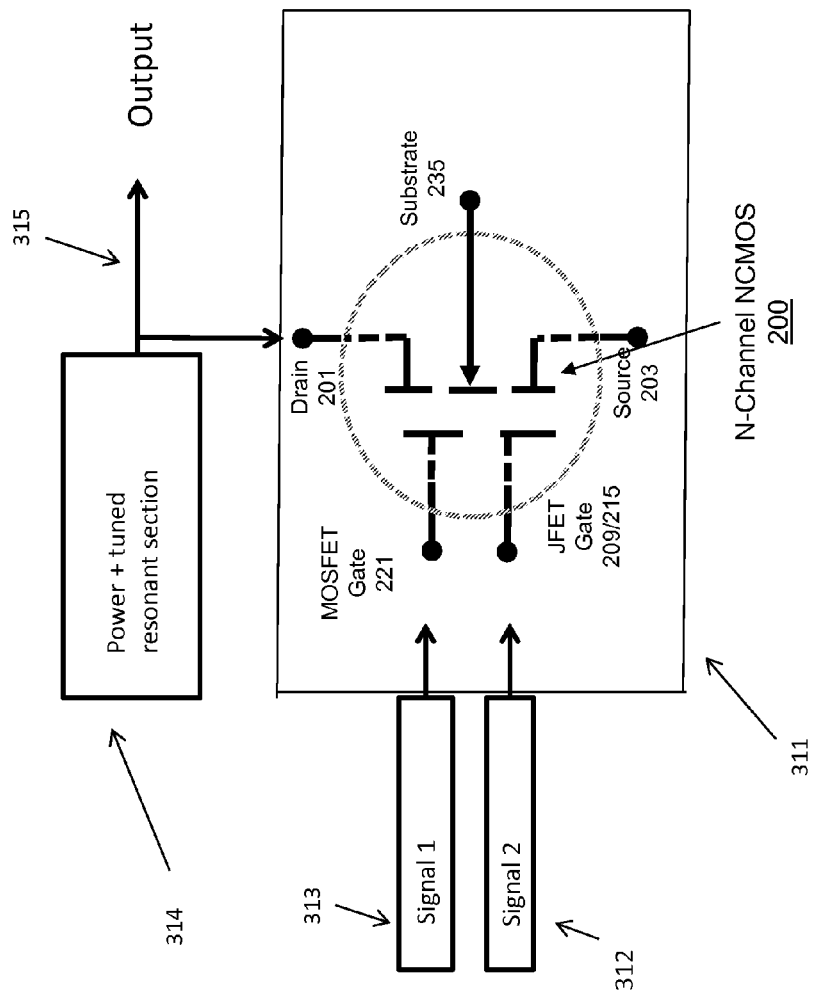
FIG. 15 shows an exemplary mixer applications with the NCMOS device in accordance with one embodiment of the invention.

FIG. 15 shows an exemplary mixer/demodulator circuit that uses an NCMOS device. Two signals, 312 and 313 can be capacitively coupled into inputs, 221 and 209/215 of NCMOS 200. Input DC decoupled bias circuitry and other circuitry for substrate 235 bias is in 311, included with the NCMOS 200. A power and resonant section, 314, brings in decoupled DC power to drain 201, and provides signal output, 315, for mixer/demodulator applications. Exemplary output 306 can be coupled out of either source 203 or drain 201.

Figure 16:
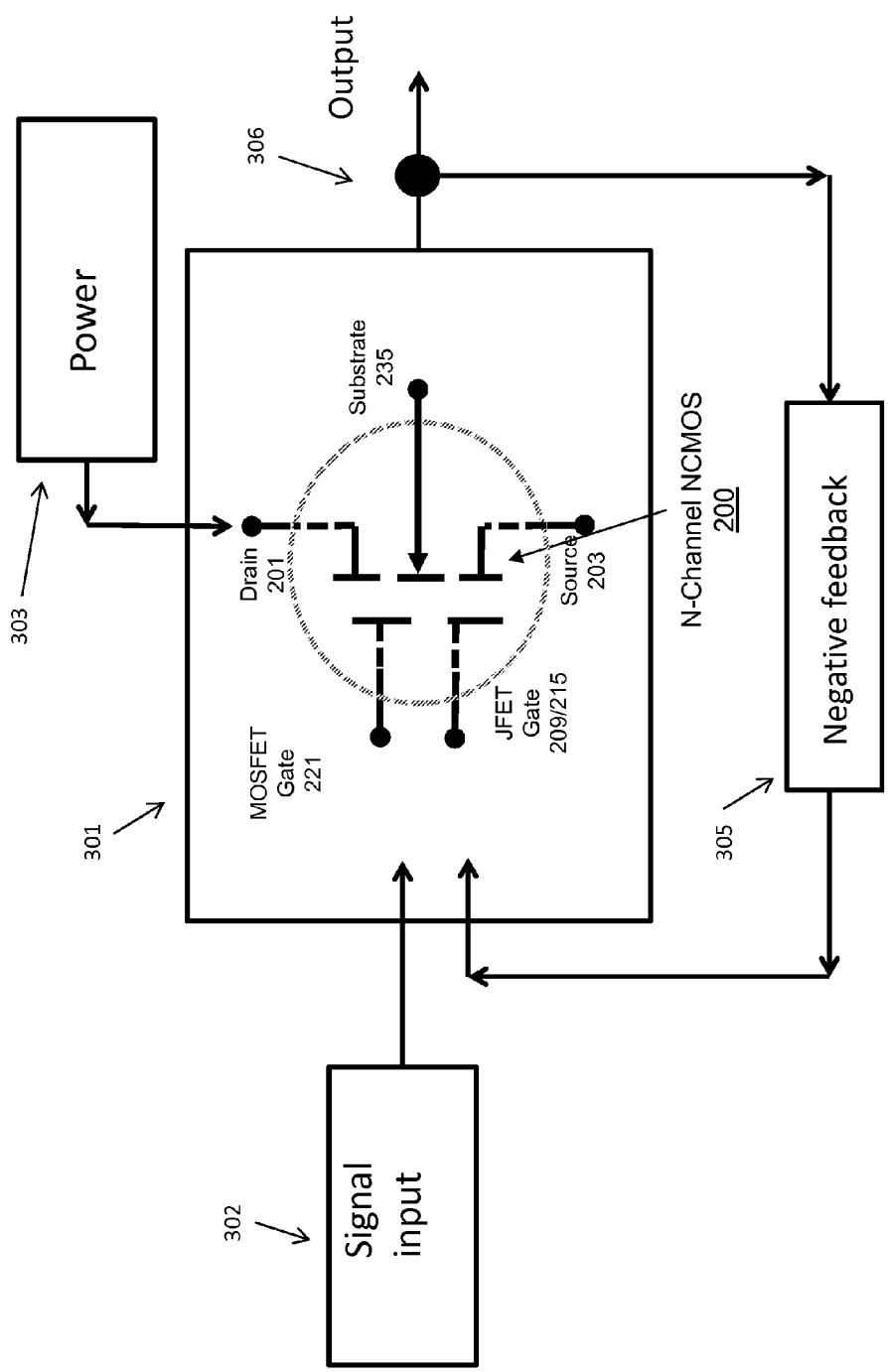
FIG. 16 shows an exemplary block diagram automatic gain control application of the NCMOS device in accordance with one embodiment of the invention.

FIG. 16 shows an exemplary circuit for amplification, using an exemplary JFET gate as an automatic gain control. Signal input 302 is coupled to exemplary MOSFET gate 221. Negative feedback 305 provides a gain control signal to JFET gate 209/215. Power 303 can be supplied to drain 201. Output with automatic gain control can be coupled out of source 203 or drain 201. Circuitry 301 included with NCMOS 200 provides power to substrate 235. Output can be coupled from the source 203 or drain 201.

FIG. 17 shows an exemplary circuit for the measurement of TID using an exemplary NCMOS 200 and external circuitry. TID irradiation causes a turn-on threshold voltage of the MOS gate 221 to become more negative with increasing TID. The exemplary JFET gate 209/215 voltage behavior is not affected by the TID irradiation. To measure TID, additional circuitry (e.g., including 402, 403, 404, 405, 406, 413, etc) determines an amount of JFET gate voltage needed to set keep the source 203 current at a constant value as the device accrues TID. An amount of JFET voltage required to maintain a constant source current is converted to a measurement of TID by a calibration or look up/comparison logic 413. For the calibration procedure, an exemplary device is placed in a calibrated radiation source, and the JFET bias required for maintaining a constant source current is measured at each TID level. Bias 401 is supplied for drain 201 and substrate 235. Circuit 402 has MOS gate bias and control. Source current is measured by circuit 404, which supplies a signal to the JFET bias control 403. The JFET control voltage is converted to TID by conversion circuit 405, giving an analog output 406. A data store can be provided which enables control systems to perform a look up to determine if the MOSFET is operating correctly or operation of the JFET is required to adjust for MOSFET malfunctions due to radiation effects. The logic section 413 can include such a data store or an external source can provide data or signals used for such a look up. Additionally, the circuit 405 can be set to issue a logic output for radiation values exceeding a set level, shown as logic output 407. Alternative embodiments can also include sections configured to detect radiation and apply voltage to the JFET sections based on a data store look up to adjust MOSFET operation to mitigate or eliminate deviation from normal MOSFET operation.

Various methods of manufacturing and operation are also provided by various embodiments of the invention. For example, a method of manufacturing can include providing a first substrate and a metal oxide semi-conductor field effect transistor (MOSFET) disposed in the first substrate section, where the MOSFET section comprises a MOSFET section, a source region formed into said MOSFET section, a drain region formed inside the MOSFET section, a gate insulator region formed on one side of the MOSFET section between the source, the substrate, and the drain covering a portion of the source and drain region, and a control gate formed over the gate insulator region. A next step can include providing a monolithic junction field effect transistor (JFET) section disposed into the first substrate comprising an opposite dopant of said first substrate placed on each side of a channel region between the source and the drain but not in contact with either the source or the drain region.

Although the invention has been described in detail with reference to certain preferred embodiments, variations and modifications exist within the spirit and scope of the invention as described and defined in the following claims.

The invention claimed is:

1. An electrical system comprising:
a first substrate section;
a metal oxide semi-conductor field effect transistor (MOSFET) section disposed in said first substrate section, said MOSFET section comprising a MOSFET section, a source region formed into said MOSFET section, a drain region formed inside said MOSFET section wherein the source region and drain region are formed on opposing sides of a semi-conductive channel region (SCR) formed in said first substrate section, a gate insulator region formed on one side of said MOSFET section adjacent to said SCR, and a control gate formed adjacent to a plane defined by said first SCR and in contact with said gate insulator region on an opposing side from a side of said gate insulator region facing said SCR; and
a first and second junction field effect transistor (JFET) section respectively disposed into said first substrate section on opposing sides of said SCR.

2. An electrical system as in claim 1, wherein said insulator layer comprises a lens shape section formed with a shape thicker in a center section of said lens shape section along a drain-source axis, operable to shape an electric field action of the MOS gate to be less strong in a center section of the drain-source axis.

3. An electrical system as in claim 1, further comprising a current leakage mitigation structure (CLMS) formed as a semi-conductive doped material in said first substrate on a same plane as said SCR and having a first and second CLMS section respectively disposed adjacent to and between said source and drain structures, said CLMS is formed with a semi-conductive dopant having a greater concentration than a same-type semi-conductive dopant within said first substrate that has an effect of directing charge away from said drain terminal from said first or second JFET sections so as to at least partially electrically isolate said first and second JFET sections from said drain, said CLMS is also formed with a CLMS contact formed to receive an external electrical voltage or bias to said CLMS.

4. A mixer system comprising:
a semiconductor device comprising:
a first substrate section;
a metal oxide semi-conductor field effect transistor (MOSFET) section disposed in said first substrate section, said MOSFET section comprising a MOSFET section, a source region formed into said MOSFET section, a drain region formed inside said MOSFET section wherein the source region and drain region are formed on opposing sides of a semi-conductive channel region (SCR) formed in said first substrate section, a gate insulator region formed on one side of said MOSFET section adjacent to said SCR, and a control gate formed adjacent to a plane defined by said SCR and in contact with said gate insulator region on an opposing side from a side of said gate insulator region facing said SCR; and
a first and second junction field effect transistor (JFET) section respectively disposed into said first substrate section on opposing sides of said SCR;
a mixer section coupled to the semi-conductive device comprising a radio frequency mixer section configured for modulation and demodulation of encoded signals passed into said semi-conductive device.

5. A system as in claim 4, wherein said insulator layer comprises a lens shape section formed with a shape thicker in a center section of said lens shape section along a drain-source axis, operable to shape an electric field action of the MOS gate to be less strong in a center section of the drain-source axis.

6. An electrical system as in claim 4, further comprising a current leakage mitigation structure (CLMS) formed as a semi-conductive doped material in said first substrate on a same plane as said SCR and having a first and second CLMS section respectively disposed adjacent to and between said source and drain structures, said CLMS is formed with a semi-conductive dopant having a greater concentration than a same-type semi-conductive dopant within said first substrate that has an effect of directing charge away from said drain terminal from said first or second JFET sections so as to at least partially electrically isolate said first and second JFET sections from said drain, said CLMS is also formed with a CLMS contact formed to receive an external electrical voltage or bias to said CLMS.

7. An automatic gain control system comprising:
a semiconductor device comprising
a first substrate section;
a metal oxide semi-conductor field effect transistor (MOSFET) section disposed in said first substrate section, said MOSFET section comprising a MOSFET section, a source region formed into said MOSFET section, a drain region formed inside said MOSFET section wherein the source region and drain region are formed on opposing sides of a semi-conductive channel region (SCR) formed in said first substrate section, a gate insulator region formed on one side of said MOSFET section adjacent to said SCR, and a control gate formed adjacent to a plane defined by said SCR and in contact with said gate insulator region on an opposing side from a side of said gate insulator region facing said SCR; and
a first and second junction field effect transistor (JFET) section respectively disposed into said first substrate section disposed on opposing sides of said SCR;
an automatic gain control section coupled to the semi-conductive device comprising an amplifier section configured with automatic gain control for signals input into said semi-conductive device.

8. A system as in claim 7, wherein said insulator layer comprises a lens shape section formed with a shape thicker in a center section of said lens shape section along a drain-source axis, operable to shape an electric field action of the MOS gate to be less strong in a center section of the drain-source axis.

9. An electrical system as in claim 7, further comprising a current leakage mitigation structure (CLMS) formed as a semi-conductive doped material in said first substrate on a same plane as said SCR and having a first and second CLMS section respectively disposed adjacent to and between said source and drain structures, said CLMS is formed with a semi-conductive dopant having a greater concentration than a same-type semi-conductive dopant within said first substrate that has an effect of directing charge away from said drain terminal from said first or second JFET sections so as to at least partially electrically isolate said first and second JFET sections from said drain, said CLMS is also formed with a CLMS contact formed to receive an external electrical voltage or bias to said CLMS.

10. An electrical system with radiation responsive, measurement, or mitigation systems comprising:
a semi-conductive device comprising:
a first substrate section;
a metal oxide semi-conductor field effect transistor (MOSFET) section disposed in said first substrate section, said MOSFET section comprising a MOSFET section, a source region formed into said MOSFET section, a drain region formed inside said MOSFET section wherein the source region and drain region are formed on opposing sides of a semi-conductive channel region (SCR) formed in said first substrate section, a gate insulator region formed on one side of said MOSFET section adjacent to said SCR, and a control gate formed adjacent to a plane defined by said SCR and in contact with said gate insulator region on an opposing side from a side of said gate insulator region facing said SCR; and
a first and second junction field effect transistor (JFET) section respectively disposed into said first substrate section disposed on opposing sides of said SCR;
a control system comprising a plurality of sections including a first section for measuring current passed through said MOSFET, performing a lookup of expected current values from a first data store section, determining if said measured current is within a predetermined range associated with at least one said expected current value in said data store section, and applying a voltage to said first and second JFET sections to operate said first and second JFET sections to adjust said measured current to said at least one expected current value, wherein said control system also determines a measurement of total ionizing radiation dose based another look up from said first data store and is further configured to output said total ionizing radiation dose measurement data to either a user interface or a data storage system.

11. An system as in claim 10, wherein said insulator layer comprises a lens shape section formed with a shape thicker in a center section of said lens shape section along a drain-source axis, operable to shape an electric field action of the MOS gate to be less strong in a center section of the drain-source axis.

12. An electrical system as in claim 10, further comprising a current leakage mitigation structure (CLMS) formed as a semi-conductive doped material in said first substrate on a same plane as said SCR and having a first and second CLMS section respectively disposed adjacent to and between said source and drain structures, said CLMS is formed with a semi-conductive dopant having a greater concentration than a same-type semi-conductive dopant within said first substrate that has an effect of directing charge away from said drain terminal from said first or second JFET sections so as to at least partially electrically isolate said first and second JFET sections from said drain, said CLMS is also formed with a CLMS contact formed to receive an external electrical voltage or bias to said CLMS.

13. An electrical system comprising:
a semi-conductive device comprising:
a first substrate section;
a metal oxide semi-conductor field effect transistor (MOSFET) section disposed in said first substrate section, said MOSFET section comprising a MOSFET section, a source region formed into said MOSFET section, a drain region formed inside said MOSFET section wherein the source region and drain region are formed on opposing sides of a semi-conductive channel region (SCR) formed in said first substrate section, a gate insulator region formed on one side of said MOSFET section adjacent to said SCR, and a control gate formed adjacent to a plane defined by said SCR and in contact with said gate insulator region on an opposing side from a side of said gate insulator region facing said SCR;
a first and second junction field effect transistor (JFET) section respectively disposed into said first substrate section disposed on opposing sides of said SCR;
wherein said insulator layer is comprises a lens shape section formed with a shape thicker in a center section of said lens shape section along a drain-source axis, operable to shape an electric field action of the MOS gate to be less strong in a center section of the drain-source axis;
a current leakage mitigation structure (CLMS) formed as a semi-conductive doped material in said first substrate on a same plane as said SCR and having a first and second CLMS section respectively disposed adjacent to and between said source and drain structures, said CLMS is formed with a semi-conductive dopant having a greater concentration than a same-type semi-conductive dopant within said first substrate that has an effect of directing charge away from said drain terminal from said first or second JFET sections so as to at least partially electrically isolate said first and second JFET sections from said drain, said CLMS is also formed with a CLMS contact formed to receive an external electrical voltage or bias to said CLMS;

control sections comprising:
  a mixer section coupled to the semi-conductive device comprising a radio frequency mixer section configured for modulation and demodulation of encoded signals passed into said semiconductor device;
  an automatic gain control section coupled to the semiconductive device comprising an amplifier section configured with automatic gain control for signals input into said semi-conductive device.

14. A method of manufacturing an electrical system comprising:
  forming and providing a first substrate section;
  forming and providing a metal oxide semi-conductor field effect transistor (MOSFET) section disposed in said first substrate section, said MOSFET section comprising a MOSFET section, a source region formed into said MOSFET section, a drain region formed inside said MOSFET section wherein the source region and drain region are formed on opposing sides of a semi-conductive channel region (SCR) formed in said first substrate section, a gate insulator region formed on one side of said MOSFET section adjacent to said SCR, and a control gate formed adjacent to a plane defined by said SCR and in contact with said gate insulator region on an opposing side from a side of said gate insulator region facing said SCR; and
  forming and providing a first and second junction field effect transistor (JFET) section respectively disposed into said first substrate section on opposing sides of said SCR.

15. A method as in claim 14, wherein said insulator layer comprises a lens shape section formed with a shape thicker in a center section of said lens shape section along a drain-source axis, operable to shape an electric field action of the MOS gate to be less strong in a center section of the drain-source axis.

16. A method as in claim 14, further comprising forming and providing a current leakage mitigation structure (CLMS) formed as a semi-conductive doped material in said first substrate on a same plane as said SCR and having a first and second CLMS section respectively disposed adjacent to and between said source and drain structures, said CLMS is formed with a semi-conductive dopant having a greater concentration than a same-type semi-conductive dopant within said first substrate that has an effect of directing charge away from said drain terminal from said first or second JFET sections so as to at least partially electrically isolate said first and second JFET sections from said drain, said CLMS is also formed with a CLMS contact formed to receive an external electrical voltage or bias to said CLMS.

17. A method as in claim 14, further comprising forming and providing a control system comprising a plurality of sections including a first section for measuring current passed through said MOSFET, performing a lookup of expected current values from a first data store section, determining if said measured current is within a predetermined range associated with at least one said expected current value in said data store section, and applying a voltage to said first and second JFET sections to operate said first and second JFET sections to adjust said measured current to said at least one expected current value, wherein said control system also determines a measurement of total ionizing radiation dose based another look up from said first data store and is further configured to output said total ionizing radiation dose measurement data to either a user interface or a data storage system.

18. A method as in claim 14, further comprising forming and providing a mixer section coupled to the semi-conductive device comprising a radio frequency mixer section configured for modulation and demodulation of encoded signals passed into said semiconductor device.

19. A method as in claim 14, further comprising forming and providing an automatic gain control section coupled to the semi-conductive device comprising an amplifier section configured with automatic gain control for signals input into said semi-conductive device.

20. A method of manufacturing and operating an electrical system with radiation responsive, measurement, or mitigation systems comprising:
  forming and providing a first substrate section;
  forming and providing a metal oxide semi-conductor field effect transistor (MOSFET) section disposed in said first substrate section, said MOSFET section comprising a MOSFET section, a source region formed into said MOSFET section, a drain region formed inside said MOSFET section wherein the source region and drain region are formed on opposing sides of a semi-conductive channel region (SCR) formed in said first substrate section, a gate insulator region formed on one side of said MOSFET section adjacent to said SCR, and a control gate formed adjacent to a plane defined by said SCR and in contact with said gate insulator region on an opposing side from a side of said gate insulator region facing said SCR;
  forming and providing a first and second junction field effect transistor (JFET) section respectively disposed into said first substrate section disposed on opposing sides of said SCR;
  forming and providing a radiation responsive, measurement, or mitigation systems (RRMMS) comprising a plurality of RRMMS sections including a first RRMMS section for measuring current passed through said MOSFET, performing a lookup of expected current values from a first data store section, determining if said measured current is within a predetermined range associated with at least one said expected current value in said data store section, and control logic operable for applying a voltage to said first and second JFET sections to operate said first and second JFET sections to adjust said measured current to said at least one expected current value, wherein said control system also determines a measurement of total ionizing radiation dose based another look up from said first data store and is further configured to output said total ionizing radiation dose measurement data to either a user interface or a data storage system; and
  operating said RRMMS system and adjusting said measured current to said at least one expected current value upon detection that said measured current value is different than said expected value.

21. A method as in claim 20, wherein said insulator layer comprises a lens shape section formed with a shape thicker in a center section of said lens shape section along a drain-source axis, operable to shape an electric field action of the MOS gate to be less strong in a center section of the drain-source axis.

22. A method as in claim 20, further comprising forming and providing a current leakage mitigation structure (CLMS) formed as a semi-conductive doped material in said first substrate on a same plane as said SCR and having a first and second CLMS section respectively disposed adjacent to and between said source and drain structures, said CLMS is formed with a semi-conductive dopant having a greater concentration than a same-type semi-conductive dopant within said first substrate that has an effect of directing charge away from said drain terminal from said first or second JFET sections so as to at least partially electrically isolate said first and second JFET sections from said drain, said CLMS is also formed with a CLMS contact formed to receive an external electrical voltage or bias to said CLMS.

23. A method as in claim 20 further comprising forming and providing a mixer section coupled to the semi-conductive device comprising a radio frequency mixer section configured for modulation and demodulation of encoded signals passed into said semiconductor device.

24. A method as in claim 20, further comprising forming and providing an automatic gain control section coupled to the semi-conductive device comprising an amplifier section configured with automatic gain control for signals input into said semi-conductive device.

* * * * *